(12) United States Patent
Dip (10) Patent No.: US 11,834,745 B2
(45) Date of Patent: Dec. 5, 2023

(54) SPATIAL ATOMIC LAYER DEPOSITION (71) Applicant: Tokyo Electron Limited, Tokyo (JP)

(72) Inventor: Anthony Dip, Cedar Creek, TX (US)

(73) Assignee: Tokyo Electron Limited, Tokyo (JP)

( * ) Notice: Subject to any disclaimer, the term of this patent is extended or adjusted under 35 U.S.C. 154(b) by 191 days.

(21) Appl. No.: 17/316,378

(22) Filed: May 10, 2021

(65) Prior Publication Data

US 2021/0395886 A1 Dec. 23, 2021

Related U.S. Application Data

(60) Provisional application No. 63/041,882, filed on Jun. 20, 2020.

(51) Int. Cl.
*C23C 16/40* (2006.01)
*C23C 16/458* (2006.01)
*C23C 16/455* (2006.01)

(52) U.S. Cl.
CPC .... *C23C 16/4583* (2013.01); *C23C 16/45544* (2013.01); *C23C 16/45559* (2013.01); *C23C 16/45565* (2013.01)

(58) Field of Classification Search
CPC .......... C23C 16/4583; C23C 16/45544; C23C 16/45559; C23C 16/45565; C23C 16/45578; C23C 16/4584; C23C 16/45551; C23C 16/4408

USPC ................ 118/719, 730; 156/345.54, 345.55
See application file for complete search history.

(56) References Cited

U.S. PATENT DOCUMENTS

| | | | |
|---|---|---|---|
| 2014/0024200 A1* | 1/2014 | Kato | H01L 21/68771 118/723 R |
| 2014/0147591 A1* | 5/2014 | Ikegawa | C23C 16/45551 427/255.28 |
| 2016/0322218 A1* | 11/2016 | Fukiage | H01L 21/0228 |

* cited by examiner

*Primary Examiner* — Rudy Zervigon
(74) *Attorney, Agent, or Firm* — Slater Matsil, LLP (57) ABSTRACT

Systems and methods are provided herein to improve the efficiency of an atomic layer deposition (ALD) cycle by providing an improved purge block design. The improved purge block prevents gas mixing, regardless of the rotational speed of the platen, by providing a lower cavity on an underside of the purge block, and in some embodiments, by providing an upper cavity on a topside of the purge block. The lower/upper cavity provides a gas conduction path that distributes purge gas evenly beneath/above the purge block and provides uniform gas flow conductance within the lower/upper cavity. Compared to conventional purge block designs, the improved purge block design described herein provides a narrower, yet more effective isolation barrier, which prevents gas mixing even at high rotational speeds of the platen.

22 Claims, 8 Drawing Sheets

(PRIOR ART)

SPATIAL ATOMIC LAYER DEPOSITION

CROSS-REFERENCE TO RELATED APPLICATIONS

This application claims the benefit of U.S. Provisional Application No. 63/041,882, filed on Jun. 20, 2020, which application is hereby incorporated herein by reference.

TECHNICAL FIELD

The present disclosure relates to the processing of substrates. In particular, it provides an apparatus and method for treating surfaces of substrates.

BACKGROUND

Atomic layer deposition (ALD) is a known technique for forming layers on a substrate. In atomic layer deposition, substrates are cyclically exposed to alternate gaseous species (or precursors). The gaseous species react with the substrate surface in a self-limiting or near self-limiting manner. A thin film may be slowly formed by repeating the cycles of alternating gaseous species.

A variety of process tools may be utilized in atomic layer deposition processes. For example, batch furnace type systems may be utilized. Single substrate systems in which a process chamber is filled with gas and evacuated for a single substrate may also be utilized. Yet another system is a spatial ALD system. In spatial ALD systems, substrates travel at relatively high speeds past a plurality of gas sources (e.g., gas injectors, a gas showerhead, or a gas showerhead with injector outlets), which inject the necessary gases proximate the substrate surface to accomplish the ALD process steps as the substrate rotates in a cyclical manner.

Spatial ALD relies on rapid movement of the substrate between alternating gas streams that are isolated from one another. For example, one exemplary spatial ALD process for forming silicon nitride may sequentially expose the substrate surface to a silicon containing precursor gas (such as, e.g., dichlorosilane, DCS) followed by exposure of the substrate surface to a nitrogen containing precursor gas (such as, e.g., ammonia, $NH_3$). In a spatial ALD system, the substrate is often rotated between the $NH_3$ and DCS precursor gases in rapid succession to build up alternate layers of silicon (Si) and then converting the silicon to silicon nitride (SiN) through exposure to $NH_3$ until a target thickness is achieved. To avoid gas mixing, the precursor gas streams (DCS, $NH_3$) are typically separated by physical barriers, purge sources or a combination of the two.

Figure 1:
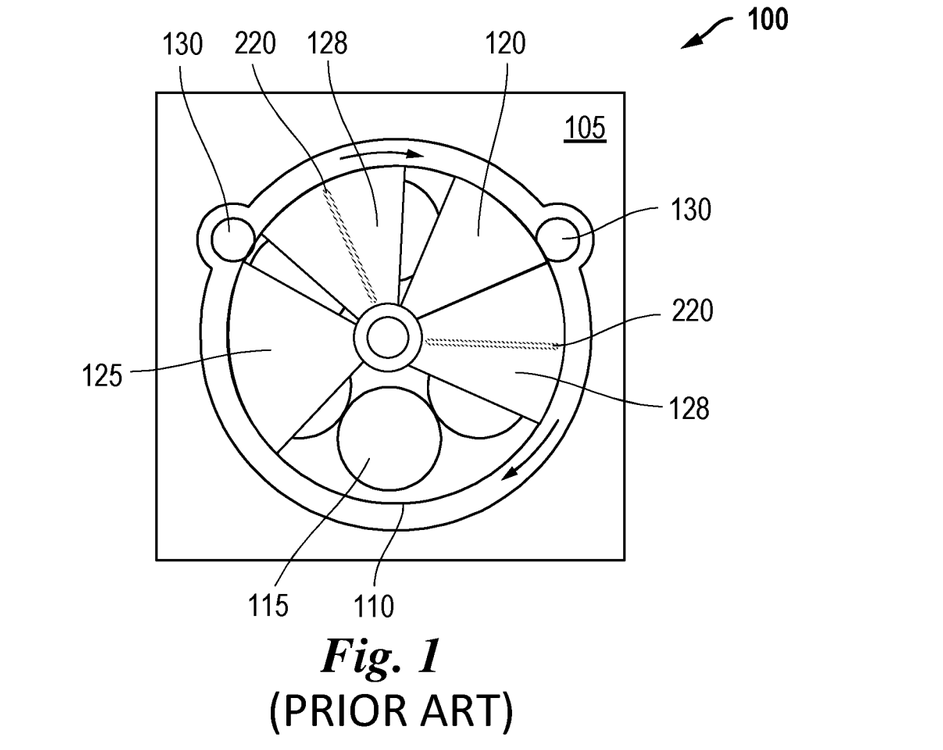
FIG. 1 (PRIOR ART) is a top-down view illustrating a conventional spatial atomic layer deposition (ALD) system in which a number of purge blocks are used to prevent reactant gases from mixing.

FIG. 1 illustrates one example of a conventional spatial ALD system that may be used to achieve an atomic layer deposition process. More specifically, FIG. 1 provides a top-down view of a substrate process tool 100 (i.e., a spatial ALD system) as seen inside a process chamber 105 of the substrate process tool 100. As shown in FIG. 1, a platen 110 is provided within the process chamber 105 for holding one or more substrates 115. Each of the substrates 115 may be arranged on a susceptor (112, FIG. 2), which supplies heat to the substrate. A number of showerheads and purge blocks may also be provided within the process chamber 105 and located above the platen no for providing various gases to the substrate. Gas outlet pumping ports 130 may also be provided.

In the conventional spatial ALD system shown in FIG. 1, a first showerhead 120 is located above the platen 110 for providing a first precursor gas (e.g., DCS) to the one or more substrates 115, and a second showerhead 125 is located above the platen 110 for providing a second precursor gas (e.g., $NH_3$) to the one or more substrates 115. In FIG. 1, the first showerhead 120 consumes approximately 45° of the 360° ALD cycle and the second showerhead 125 consumes about 79° of the ALD cycle. As the platen 110 rotates (as indicated by the arrows), the one or more of substrates 115 are moved in sequence under the first showerhead 120 and then under the second showerhead 125 to perform one cycle of the atomic layer deposition process. The rotation of the platen 110 and the substrates 115 may be repeated for a number of ALD cycles. Although not shown in FIG. 1, a controller may be provided for controlling various operating parameters of the spatial ALD system including, for example, temperatures, gas flows, pressures, rotation speeds, number of ALD cycles, etc.

In some ALD processes, the platen 110 may be rotated at relatively high speeds to reduce process time and costs. The faster the platen 110 is rotated, the quicker the target film thickness will be reached. However, as rotational speed increases (e.g., above 10 revolutions per minute (RPM)), the probability of gas mixing increases, unless significant countermeasures are taken. Gas mixing is due to viscous drag forces and occurs when gas impinging on the susceptor surface is carried by the platen 110 as the platen rotates. Unless the gas layer can be mechanically restricted by physical barriers, purged by an inert gas (such as nitrogen) or a suitable combination of both, gas mixing will occur when rotational speeds exceed a certain point.

In the spatial ALD system shown in FIG. 1, purge blocks 128 provide a gas purge (e.g., an argon, nitrogen, or other inert gas purge) after the substrates 115 rotate past each of the showerheads to prevent the precursor gases from mixing. Conventional purge blocks 128 may be configured in any number of manners, such as a line of gas injectors, a line of gas injectors in a separate partitioned zone, a showerhead, etc. In the spatial ALD system shown in FIG. 1, the purge blocks 128 are implemented as showerheads having a central line of gas injectors.

Figure 2:
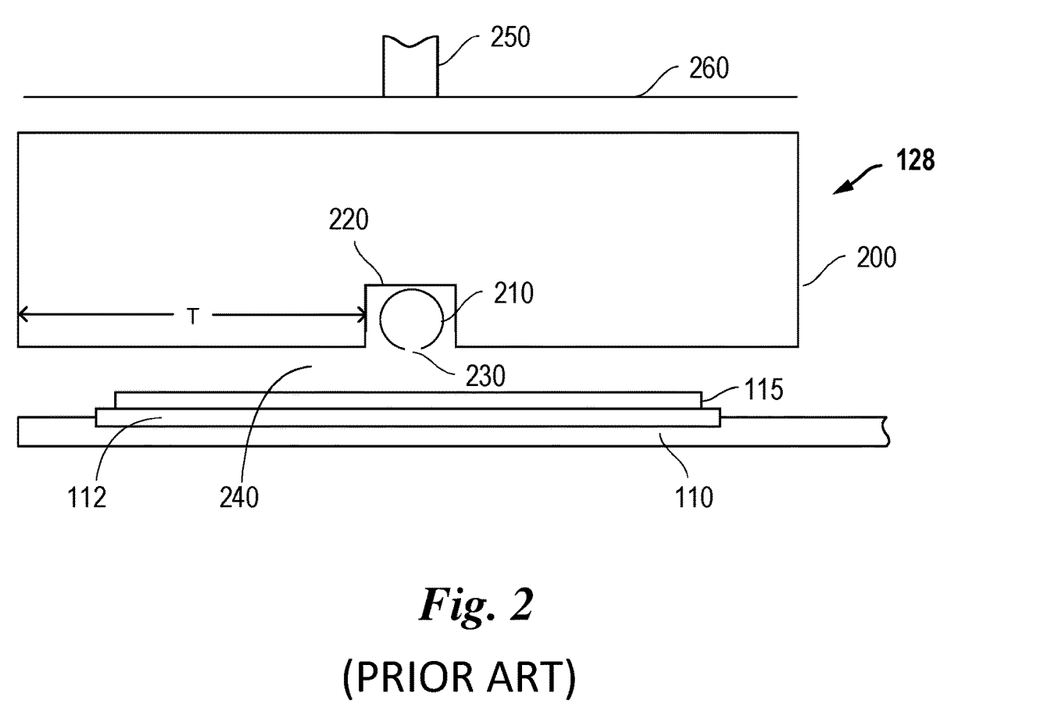
FIG. 2 (PRIOR ART) is a cross-sectional view through one of the purge blocks shown in FIG. 1.

FIG. 2 provides a cross sectional view through one of the purge blocks 128 shown in FIG. 1 when a substrate 115 arranged on a susceptor 112 is rotated under the purge block 128. In the conventional design shown in FIG. 2, the purge block 128 combines a wide (e.g., 60°) mechanical barrier 200 with a centrally located purge gas injector 210. The purge gas injector 210, which is located within a narrow conduction path 220 provided on an underside of the purge block 128, comprises a number of ports 230 for injecting a purge gas into a process space 240 arranged above the substrate 115. In some cases, a second purge gas injector 250 may also be provided for injecting a purge gas above the purge block 128, when the purge block is not directly bolted to the chamber lid 260. In such cases, the second purge gas injector 250 may be used to prevent precursor diffusion through the gap between the chamber lid 260 and the topside of the purge block 128.

To prevent the precursor gases from mixing within the process space 240, the purge block 128 provides a purge gas (e.g., argon, nitrogen or another inert gas) to the substrate surface as the platen no rotates around a central axis of the substrate processing tool 100. At slow rotational speeds (e.g., below 10 RPM), the purge gas provided by the purge gas injector 210 combined with the wide mechanical barrier 200 may provide an effective isolation barrier to prevent the precursor gases from mixing. Although the purge blocks 128 shown in FIGS. 1 and 2 may effectively isolate precursor gases at slow rotational speeds, they occupy a large portion of the ALD cycle, lack efficiency and often fail to prevent gas mixing at higher rotational speeds (e.g., above 10 RPM).

For example, the gas flow conductance through the conduction path 230 is linearly proportional to the wall thickness (T) between a side edge of the conduction path 230 and a side edge of the purge block 128, and decreases as wall thickness (T) increases (and vice versa). In the purge block design shown in FIGS. 1 and 2, the gas flow conductance near the outer edge of the platen 110 (where T is larger) is less than the gas flow conductance near the central axis (where T is smaller). Because the gas flow conductance is non-uniform and varies greatly along the radial axis of the purge block 128, more purge gas must be injected into the outer region of the purge block 128 to prevent gas mixing, even when the platen 110 is rotated at low rotational speeds. Since higher rotational speeds result in greater radial velocity (especially near the outer edge of the platen 110), a proportionally greater volume of purge gas is needed to resist viscous drag forces and prevent gas mixing at higher rotational speeds.

The purge block 128 shown in FIGS. 1 and 2 relies on a purge gas injector 210 design, which places a higher density of ports 230 near the outer edge of the platen no where more purge gas volume is needed. Although such an injector design may be used to increase the volume of purge gas near the outer edge of the platen 110, the purge block 128 design shown in FIGS. 1 and 2 often fails to prevent gas mixing at high rotational speeds (e.g., above 10 RPM), due to the non-uniform gas flow conductance provided along the radial axis of the purge block.

In addition to failing to effectively prevent gas mixing at high rotational speeds, the purge blocks 128 shown in FIGS. 1 and 2 occupy a large portion of the ALD cycle. For example, approximately one-third (e.g., 120°) of the ALD cycle is spent under the purge blocks 128 shown in FIGS. 1 and 2, leaving only two-thirds of the cycle for exposure to the precursor gases. However, it is generally desirable to maximize the time spent under the precursor gas streams to minimize the ALD cycle time. If purging were more efficient, a shorter ALD cycle could be achieved for a given fixed precursor exposure time, thereby providing a lower cost process with a higher wafer throughput.

Thus, it would be desirable to provide a system and method that improves the efficiency of an ALD cycle by providing an improved purge block design.

SUMMARY

Systems and methods are provided herein to improve the efficiency of an atomic layer deposition (ALD) cycle by providing an improved purge block design. The improved purge block prevents gas mixing, regardless of the rotational speed of the platen, by providing a lower cavity on an underside of the purge block, and in some embodiments, by providing an upper cavity on a topside of the purge block. The lower/upper cavity provides a gas conduction path that distributes purge gas evenly beneath/above the purge block and provides uniform gas flow conductance within the lower/upper cavity. Compared to conventional purge block designs, the improved purge block design described herein provides a narrower, yet more effective isolation barrier, which prevents gas mixing even at high rotational speeds of the platen.

According to one embodiment, a spatial atomic layer deposition (ALD) system is provided herein comprising a platen carrying one or more substrates, wherein the platen rotates 360° around a central axis of the spatial ALD system; a first showerhead located above the platen to provide a first processing gas to the one or more substrates as the platen rotates; and a purge block located above the platen to provide a purge gas to the one or more substrates after the first processing gas is provided to the one or more substrates. In this embodiment, the purge block comprises a lower cavity formed on an underside of the purge block, and a first purge gas injector provided within the lower cavity for injecting the purge gas beneath the purge block. The lower cavity provides a gas conduction path that distributes the purge gas beneath the purge block, such that the purge gas flows evenly along a side edge of the purge block in a direction normal to the side edge of the purge block.

In some embodiments, a contour of the lower cavity may be similar to yet smaller than a contour of the purge block, so that a uniform wall thickness is obtained along a majority of the purge block. In such embodiments, the uniform wall thickness may be measured between a side edge the lower cavity and the side edge of the purge block. In some embodiments, the uniform wall thickness may be selected from a range comprising 20 mm to 80 mm. In other embodiments, a wall thickness within one or more regions of the purge block may be different from a wall thickness within other regions of the purge block to vary a gas flow conductance provided within the lower cavity in the one or more regions of the purge block.

In some embodiments, the purge block may further comprise an upper cavity formed on a topside of the purge block, and a second purge gas injector for injecting a second purge gas above the purge block. When included, the upper cavity may provide a gas conduction path that distributes the second purge gas above the purge block, such that the second purge gas flows evenly along the side edge of the purge block in the direction normal to the side edge of the purge block.

In some embodiments, a contour of the upper cavity may be similar to yet smaller than a contour of the purge block, so that a uniform wall thickness is obtained along a majority of the purge block. In such embodiments, the uniform wall thickness may be measured between the gas conduction path provided within the upper cavity and the side edge of the purge block. In some embodiments, the uniform wall thickness may be selected from a range comprising 20 mm to 80 mm. In other embodiments, a wall thickness within one or more regions of the purge block may be different from a wall thickness within other regions of the purge block to vary a gas flow conductance provided within the upper cavity in the one or more regions of the purge block.

In some embodiments, a width of the purge block may cover a portion of the 360° rotation of the platen, wherein the portion is selected from a range comprising 10° to 40° of the 360° rotation of the platen. In one example embodiment, the width of the purge block may cover 20° of the 360° rotation of the platen. In another example embodiment, the width of the purge block may cover 30° of the 360° rotation of the platen.

According to another embodiment, a spatial ALD system is provided herein comprising a platen carrying one or more substrates, wherein the platen rotates 360° around a central axis of the spatial ALD system; a first showerhead located above the platen to provide a first processing gas to the one or more substrates as the platen rotates; and a purge block located above the platen to provide a purge gas to the one or more substrates after the first processing gas is provided to the one or more substrates. In this embodiment, a width of the purge block may cover a portion of the 360° rotation of the platen, wherein the portion is selected from a range comprising 10° to 40° of the 360° rotation of the platen. In one implementation, for example, the width of the purge block may cover between 20° to 30° of the 360° rotation of the platen.

In some embodiments, the purge block may comprise a lower cavity formed on an underside of the purge block, and a first purge gas injector provided within the lower cavity for injecting the purge gas beneath the purge block. The lower cavity may provide a gas conduction path that distributes the purge gas beneath the purge block, such that the purge gas flows evenly along a side edge of the purge block in a direction normal to the side edge of the purge block.

In some embodiments, a contour of the lower cavity may be similar to yet smaller than a contour of the purge block, so that a uniform wall thickness is obtained along a majority of the purge block. In such embodiments, the uniform wall thickness may be measured between the gas conduction path provided within the lower cavity and the side edge of the purge block.

In some embodiments, the purge block may further comprise an upper cavity formed on a topside of the purge block, and a second purge gas injector for injecting a second purge gas above the purge block. The upper cavity may provide a gas conduction path that distributes the second purge gas above the purge block, such that the second purge gas flows evenly along the side edge of the purge block in the direction normal to the side edge of the purge block.

In some embodiments, a contour of the lower cavity and a contour of the upper cavity may be similar to yet smaller than a contour of the purge block, so that a uniform wall thickness is obtained along a majority of the purge block. In such embodiments, the uniform wall thickness may be measured between side edges the lower cavity and the upper cavity and the side edge of the purge block. For example, the uniform wall thickness may be selected from a range comprising 20 mm to 80 mm. In other embodiments, a wall thickness within one or more regions of the purge block may be different from a wall thickness within other regions of the purge block to vary a gas flow conductance provided within the lower cavity and the upper cavity in the one or more regions of the purge block.

According to yet another embodiment, a method is provided herein for processing a substrate within a spatial ALD system, wherein the spatial ALD system comprises a platen and a purge block, which is located above the platen to provide a purge gas to a process space above the substrate. The method may generally include providing the substrate on the platen; sequentially exposing the substrate to a first processing gas and a second processing gas as the platen rotates around a central axis of the spatial ALD system; injecting the purge gas within a lower cavity formed on an underside of the purge block after exposing the substrate to the first processing gas and before exposing the substrate to the second processing gas; and preventing the first processing gas and the second processing gas from mixing within the process space by distributing the purge gas within the lower cavity, so that the purge gas flows evenly along a side edge of the purge block in a direction normal to the side edge of the purge block.

In some embodiments, when the purge gas is injected within the lower cavity, the method may further include: injecting a second purge gas within an upper cavity formed on a topside of the purge block; and distributing the second purge gas within the upper cavity, so that the second purge gas flows evenly along the side edge of the purge block in the direction normal to the side edge of the purge block.

In some embodiments, the method may further include: rotating the platen at a high rotational speed greater than 10 revolutions per minute (RPM). By injecting the purge gas within the lower cavity and distributing the purge gas within the lower cavity, the first processing gas is isolated from the second processing gas, even when the platen is rotated at the high rotational speed.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION OF ILLUSTRATIVE EMBODIMENTS

Systems and methods are provided herein to improve the efficiency of an atomic layer deposition (ALD) cycle by providing an improved purge block design. Compared to conventional purge block designs, the improved purge block design described herein provides a narrower, yet more effective isolation barrier, which prevents gas mixing even at high rotational speeds (e.g., above 10 RPM).

In the disclosed embodiments, the improved purge block prevents gas mixing, regardless of the rotational speed of the platen, by providing a lower cavity on an underside of the purge block, and in some embodiments, by providing an upper cavity on a topside of the purge block. The lower cavity (and the upper cavity) provides a gas conduction path that distributes purge gas evenly beneath (and above) the purge block and provides uniform gas flow conductance within the lower cavity (and the upper cavity).

Uniform gas flow conductance is provided within the lower cavity (and in the upper cavity) by providing a relatively wide conduction path for the purge gas to flow. In the disclosed embodiments, a wide conduction path is provided by forming the lower/upper cavity, such that a contour of the lower/upper cavity is similar to, yet smaller than, a contour of the purge block. This enables a substantially uniform wall thickness (T) to be obtained along a majority of the purge block. As used herein, a uniform thickness has a variation of 15% or less. The wide conduction path provided within the lower/upper cavity enables the purge gas to evenly pressurize a volume of the lower/upper cavity, which in turn, enables the purge gas to: (a) flow more evenly along the periphery of the purge block, and (b) flow in a direction that is substantially normal to a side edge of the purge block. This enables the improved purge block design to provide a more effective isolation barrier, which prevents gas mixing even at high rotational speeds (e.g., above 10 RPM).

Figure 3:
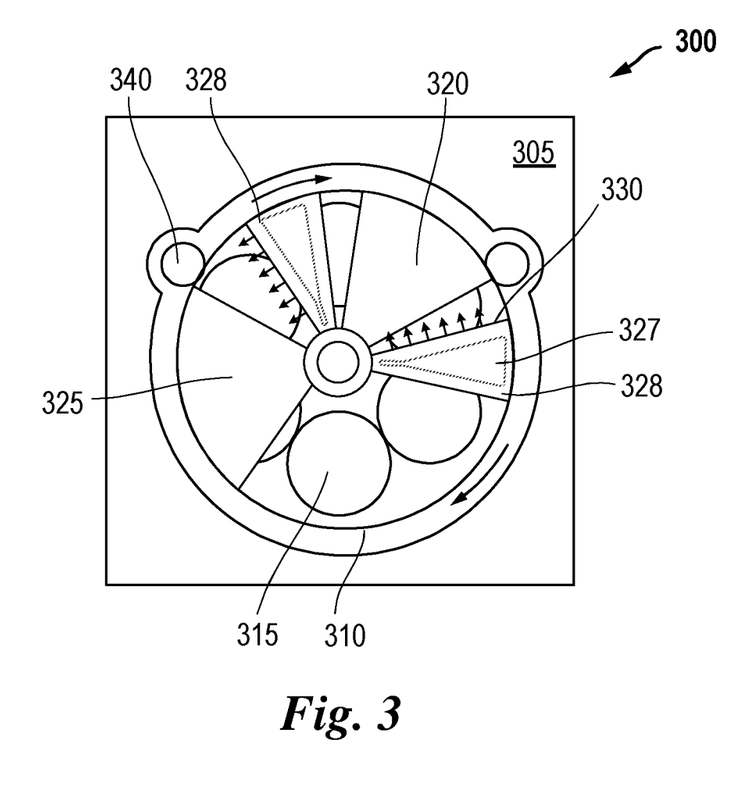
FIG. 3 is a top-down view illustrating one embodiment of a spatial ALD system having narrower, more efficient purge blocks.
Figure 4:
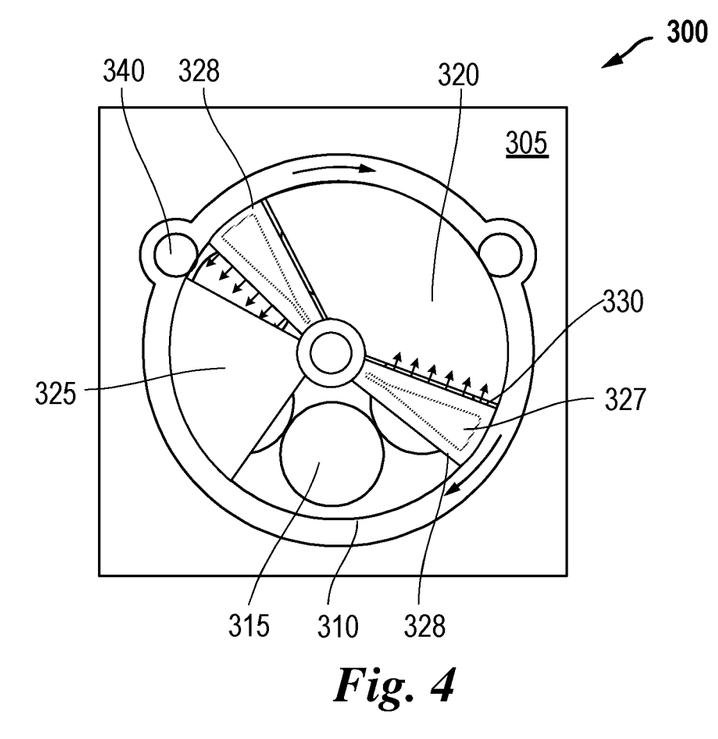
FIG. 4 is a top-down view illustrating another embodiment of a spatial ALD system having narrower, more efficient purge blocks.

FIGS. 3 and 4 illustrate various embodiments of a spatial ALD system having narrower, more efficient purge blocks. More specifically, FIGS. 3 and 4 provide top views of a substrate process tool 300 (i.e., a spatial ALD system) as seen inside a process chamber 305 of the substrate process tool 300. Similar to the substrate process tool 100 shown in FIG. 1, the substrate process tool 300 shown in FIGS. 3 and 4 includes a platen 310 within the process chamber 305 for carrying one or more substrates 315. The platen 310 rotates 360° around a central axis of the substrate process tool 300 to perform one or more cycles of an ALD process. A number of showerheads 320, 325 and a number of purge blocks 328 are also provided within the process chamber 305 and located above the platen 310 for providing various gases to the substrate as the platen rotates. Gas outlet pumping ports 340 are also provided within the process chamber 305 for removing exhaust gases from the substrate process tool 300.

In the spatial ALD system shown in FIGS. 3 and 4, a first showerhead 320 and a second showerhead 325 are located above the platen 310 for providing various processing gases to the substrates 315. In some embodiments, the first showerhead 320 may provide a first precursor gas to the substrates 315, and the second showerhead 325 may provide a second precursor gas to the one or more substrates 315. In one example ALD process for forming silicon nitride, the first precursor gas may be a silicon containing precursor gas (such as, e.g., dichlorosilane, (DCS)) and the second precursor gas may be a nitrogen containing precursor gas (such as, e.g., ammonia, $NH_3$). It is recognized, however, that the first showerhead 120 and the second showerhead 125 may provide other processing gases (including, for example, reactive precursors, non-reactive precursors and/or inert gases) to the substrates 315 when performing other ALD processes.

As the platen 310 rotates (as indicated by the arrows), the substrates 315 are moved in sequence under the first showerhead 320 and then under the second showerhead 325 to perform one cycle of the atomic layer deposition process. In the example ALD process mentioned above, the substrates 315 are rotated under the first showerhead 320 to expose the substrate surface to a first precursor gas (e.g., DCS) and before they are rotated under the second showerhead 325 to expose the substrate surface to a second precursor gas (e.g., $NH_3$). To prevent the first and second precursor gases from mixing, purge blocks 328 provide a gas purge (e.g., an argon (Ar) nitrogen ($N_2$), purge or another inert gas purge) to the substrate surface after the substrates 315 rotate past each of the showerheads 320, 325. This process may be repeated for a number of ALD cycles until a target thickness for the silicon nitride layer is achieved. Although not shown in FIGS. 3 and 4, a controller may be provided within, or may be coupled to, the substrate process tool 300 for controlling various operating parameters of the spatial ALD system including, for example, temperatures, gas flows, pressures, rotation speeds, number of ALD cycles, etc.

Unlike the substrate process tool 100 shown in FIG. 1, the substrate process tool 300 shown in FIGS. 3 and 4 utilizes narrower, more efficient purge blocks 328. In some embodiments, the purge blocks 328 shown in FIGS. 3 and 4 may consume up to 67% less area than the purge block 128 design shown in FIGS. 1 and 2. Utilizing a narrower purge block 328 design in the substrate process tool 300 enables the ALD cycle time to be reduced and/or the precursor exposure dose/time to be increased.

FIG. 3 illustrates one embodiment of a narrow purge block 328 design, which reduces the area consumed by the purge block by approximately 50% compared to the purge block 128 design shown in FIGS. 1 and 2. In the embodiment shown in FIG. 3, each of the purge blocks 328 consumes 30° of the ALD cycle. The narrow purge block 328 design shown in FIG. 3 enables the purge blocks to be physically separated away from one or more of the showerheads (e.g., the first showerhead 320 and/or the second showerhead 325) included within the substrate process tool 300. The physical separation between the purge blocks and the showerhead(s) improves the precursor dose provided by the showerhead(s) by reducing purge gas subduction under the showerhead cover plate.

In one embodiment, the area (or portion of the ALD cycle) consumed by the first showerhead 320 and/or the second showerhead 325 may be similar to that shown in FIG. 1 and described above. For example, the first showerhead 320 may consume 45° of the ALD cycle and the second showerhead 325 may consume 79° of the ALD cycle. When used in such an embodiment, the narrow purge block 328 design shown in FIG. 3 may improve the precursor dose provided by the showerhead(s) for the same ALD cycle time (if the rotational speed of the platen 110 is maintained) by reducing purge gas subduction under the showerhead cover plate. Alternatively, the narrow purge block 328 design shown in FIG. 3 may be used to reduce the ALD cycle time (by increasing the rotational speed of the platen no) to the extent permitted by the precursor dose increase due to the reduction of $N_2$ subduction effects. In other embodiments, the narrow purge block 328 design shown in FIG. 3 may enable the precursor dose/time to be increased by freeing up space for larger showerhead(s). An example of this is shown in FIG. 4.

FIG. 4 illustrates another embodiment of a narrow purge block 328 design, which reduces the area consumed by the purge block by approximately 67% compared to the purge block 128 design shown in FIGS. 1 and 2. In the embodiment shown in FIG. 4, the purge blocks 328 each consume 20° of the ALD cycle. The narrower purge block 328 design shown in FIG. 4 enables the precursor dose provided by one or more of the showerheads (e.g., the first showerhead 320 and/or the second showerhead 325) to be increased by increasing the size of the showerhead(s).

In the embodiment shown in FIG. 4, the narrow purge block 328 design enables a much larger first showerhead 320 to be used to increase the precursor dose (and/or the precursor exposure time) provided by the first showerhead. In one example implementation, the first showerhead 320 shown in FIG. 4 may consume 135° of the ALD cycle and the second showerhead 325 may consume 79° of the ALD cycle. By increasing the area (or portion of the ALD cycle) consumed by the first showerhead 320 (e.g., from 45° to 135°), the embodiment shown in FIG. 4 may increase the precursor dose provided by the first showerhead 320 by a factor of 3.

Although examples of narrow purge block 328 designs are shown in FIGS. 3 and 4 and described above, the techniques described herein are not strictly limited to the few examples discussed above. In other embodiments, a narrow purge block 328 in accordance with the techniques described herein may consume a greater or lesser portion of the ALD cycle. For example, a narrow purge block 328 may consume approximately 10° to 40° of the ALD cycle, while retaining the advantages described herein.

In the examples provided above, the width of the first showerhead 320, the second showerhead 325 and the purge block 328 is described as an angular measurement (expressed in degrees) of one ALD cycle. This description assumes that one ALD cycle is performed for every 360° rotation of the platen 310. However, some spatial ALD systems may perform more than one ALD cycle per 360° rotation of the platen 310. To account for such systems, the width of the first showerhead 320, the second showerhead 325 and the purge block 328 may alternatively be described as an angular measurement (expressed in degrees) of the 360° rotation of the platen 310. For example, the width of the purge block 328 may alternatively be described as covering a portion of the 360° rotation of the platen 310, wherein the portion is selected from a range comprising about 10° to about 40° of the 360° rotation of the platen 310. In the embodiments shown in FIGS. 3 and 4, the width of the purge block 328 covers approximately 30° and approximately 20° of the 360° rotation of the platen 310, respectively. Other widths covering alternative angular measurements may also be used for the purge block 328.

In addition to reducing the portion of the ALD cycle consumed by the gas purge, the techniques described herein improve purge gas efficiency and prevent gas mixing even at high rotational speeds (e.g., above 10 RPM). As described in more detail below, the disclosed techniques improve purge gas efficiency by providing a lower cavity on an underside of the purge block 328 that provides a high gas conductance pathway for dispersing the purge gas evenly beneath the purge block. In some embodiments, an upper cavity may similarly be provided on a topside of the purge block 328 to disperse purge gas evenly above the purge block. In some embodiments, the purge gas flow out of the purge block 328 may be further controlled by providing the lower cavity (and optionally, the upper cavity) with a customized gas conduction path, which distributes the purge gas flux as needed to compensate for radial variations in the velocity of the platen 310. This enables the disclosed purge block 328 designs to isolate the processing gases, even at high rotational speeds (e.g., above 10 RPM), without increasing the purge gas volume.

Figure 5:
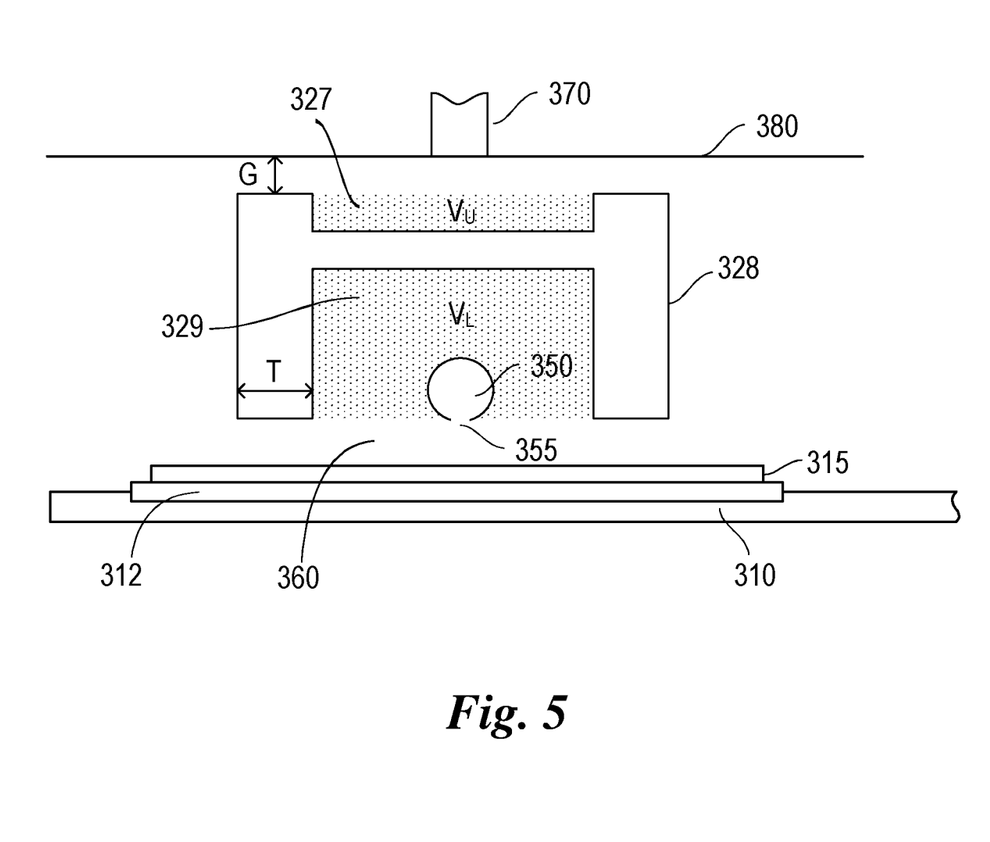
FIG. 5 is a cross-sectional view through one of the purge blocks shown in FIGS. 3 and 4, depicting an upper cavity and a lower cavity formed within the purge block.
Figure 6:
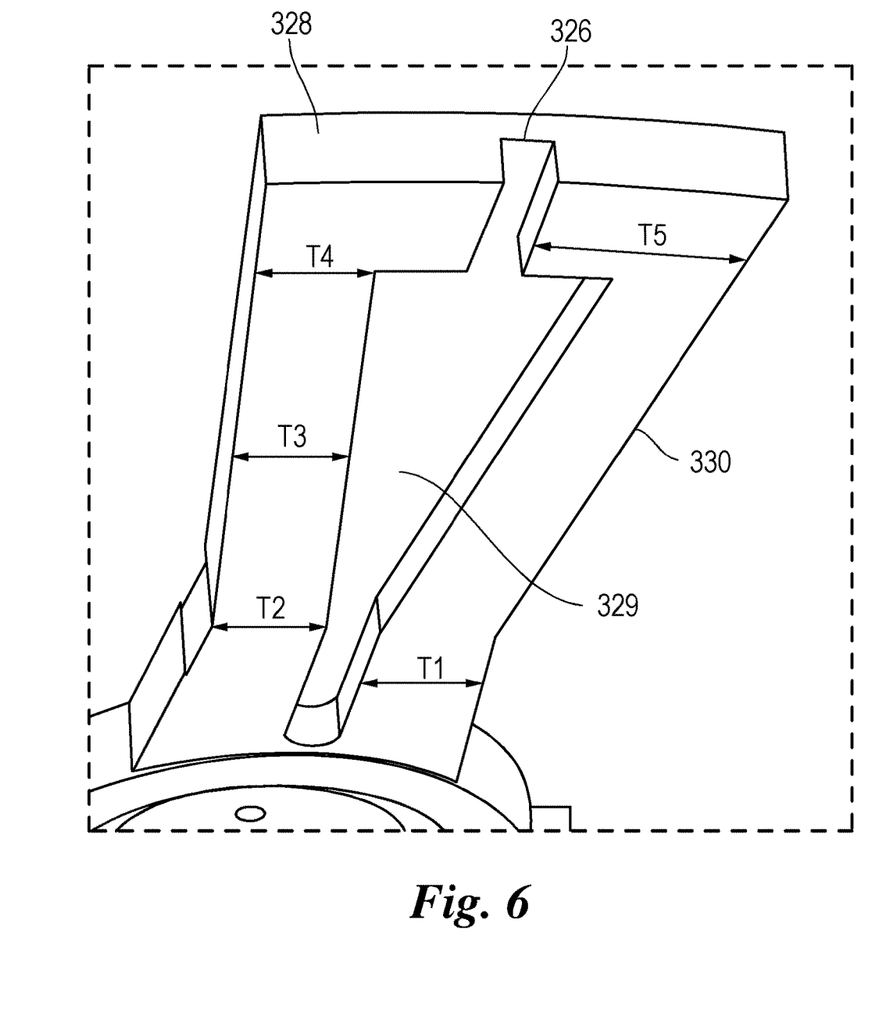
FIG. 6 is a perspective view of an underside of one of the purge blocks shown in FIGS. 3 and 4, illustrating one example of a lower cavity formed therein.
Figure 7:
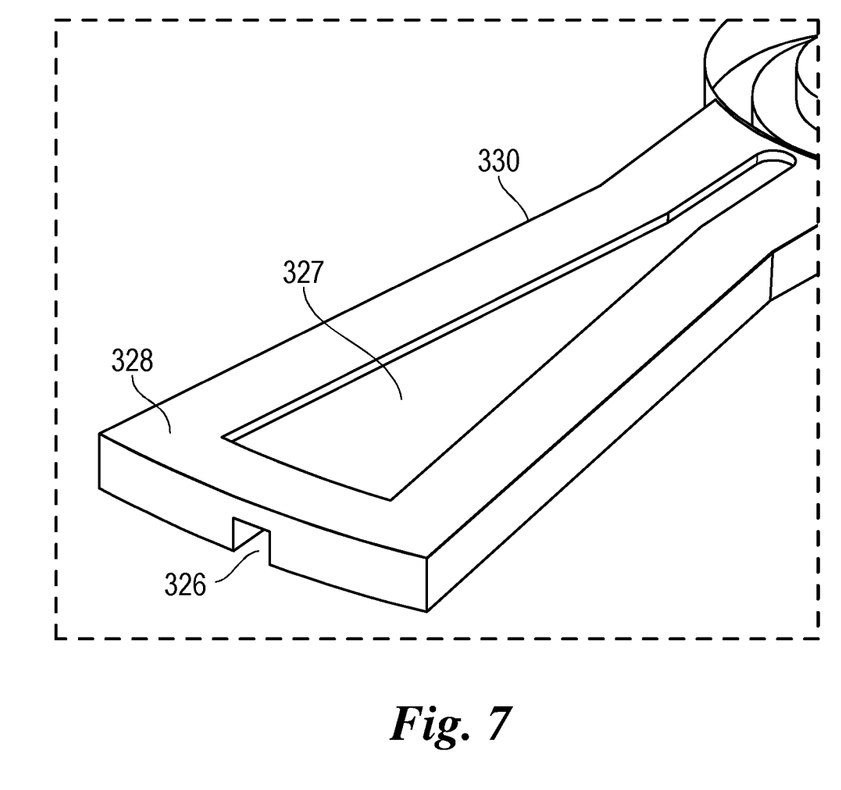
FIG. 7 is a perspective view of a topside of one of the purge blocks shown in FIGS. 3 and 4, illustrating one example of an upper cavity formed therein.

FIGS. 5-7 provide various embodiments of an improved purge block design in accordance with the techniques described herein. Specifically, FIG. 5 provides a cross sectional view through one of the purge blocks 328 shown in FIG. 3 or 4 when a substrate 315 arranged on a susceptor 312 is rotated under the purge block. As shown in FIG. 5, the purge block 328 may include both an upper cavity 327 and a lower cavity 329, in some embodiments. In some embodiments, only a lower cavity may be utilized. The lower cavity 329 formed on an underside of the purge block 328 comprises a lower volume ($V_L$). The upper cavity 327 formed on a topside of the purge block 328 comprises an upper volume ($V_U$).

In the embodiment shown in FIG. 5, a first purge gas injector 350 is provided within the lower cavity 329 for injecting a purge gas from a gas input location generally proximate the central axis of the system into the process space 360 located below the purge block 328 and above the substrate 315. In the one embodiment, the first purge gas injector 350 may extend completely through the lower cavity 329. Alternatively, the first purge gas injector 350 may extend partially through the lower cavity 329.

The first purge gas injector 350 may generally include a number of ports 355 for injecting a purge gas (e.g., Ar, $N_2$ or another inert purge gas) into the process space 360. In some embodiments, the first purge gas injector 350 may comprise a higher density of ports 355 near the outer edge of the platen 310, so that the first purge gas injector 350 injects more purge gas volume near the outer edge of the platen 310. In some embodiments, the density of ports 355 may decrease as it approaches the center of the susceptor 312. As noted above, providing a higher density of ports 355 near the outer edge of the platen 310 may provide more purge gas volume where it is needed to resist viscous drag forces and prevent gas mixing at higher rotational speeds. In other embodiments, the ports 355 may be evenly spaced along the radial axis of the first purge gas injector 350. In such embodiments, the improved purge block design described herein may resist viscous drag forces and prevent gas mixing at higher rotational speeds.

In some embodiments, a second purge gas injector 370 may also be provided for injecting a purge gas (e.g., Ar, $N_2$ or another inert purge gas) above the purge block 328. For example, when purge block 328 is not directly connected to the chamber lid 380, a gap (G) may be formed between an underside of the chamber lid 380 and a topside of the purge block 328. In such embodiments, the second purge gas injector 370 may be used to inject purge gas into the upper cavity 327 of the purge block 328, thereby preventing precursor diffusion through the gap. However, the second purge gas injector 370 is not strictly necessary, and may be omitted in some embodiments, when the purge block 328 is directly connected to the chamber lid 380. The upper cavity 327 may also be omitted when the purge block 328 is directly connected to the chamber lid 380.

As the platen 310 rotates around a central axis of the substrate process tool 300, the first purge gas injector 350 provides purge gas (e.g., Ar, $N_2$ or another inert purge gas) to the surface of the substrate 315 to prevent precursor gases (e.g., DCS and $NH_3$) from mixing within the process space 360. As noted above, gas mixing is caused by viscous drag forces and occurs when gas impinging on the surface of the susceptor 312 is carried by the platen 310 as the platen rotates. As further noted above, the probability of gas mixing increases as the rotational speed of the platen 310 increases. Thus, at high rotational speeds (e.g., above 10 RPM), gas mixing is likely to occur unless significant countermeasures are taken.

The purge block 328 design shown in FIGS. 3-7 effectively prevents gas mixing (i.e., provides near complete isolation between the first and second precursor gases), regardless of the rotational speed of the platen 310, by providing a lower cavity 329 on the underside of the purge block 328 and (in some embodiments) an upper cavity 327 on the topside of the purge block. Unlike the narrow conduction path 220 shown in FIGS. 1 and 2, the upper cavity 327 and the lower cavity 329 formed within the purge block 328 provide relatively wide conduction paths for the purge gas to flow (see, FIGS. 5-7). The wide conduction paths provided within the upper cavity 327 and the lower cavity 329 enable the purge gas to evenly pressurize the upper volume ($V_U$) and the lower volume ($V_L$), respectively, which in turn, enables the purge gas to: (a) flow more evenly along the periphery of the purge block 328, and (b) flow in a direction that is substantially normal to a side edge 330 of the purge block 328 (as depicted by arrows in FIGS. 3-4). By providing uniform gas flow conductance within the upper cavity 327 and/or the lower cavity 329, the purge block 328 design shown in FIGS. 3-7 is more effective in preventing gas mixing (due, e.g., to purge gas subduction into the precursor sector or precursor gas subduction into the purge gas sector) than the conventional purge block 128 design shown in FIGS. 1 and 2.

FIGS. 6 and 7 provide perspective views of the purge block 328 design shown in FIGS. 3-5. More specifically, FIG. 6 provides a perspective view of the underside of the purge block 328, illustrating one example of a lower cavity 329 that may be formed therein. A topside view of the purge block 328 is shown in FIG. 7 to illustrate one example of an upper cavity 327 that may be formed on the topside of the purge block 328. It is recognized, however, that the lower cavity 329 and the upper cavity 327 depicted in FIGS. 6 and 7 are merely exemplary and represent only one example of a high gas conductance pathway or customized gas conduction path, which may be included within the purge block 328 to: (a) distribute purge gas evenly beneath/above the purge block 328, and/or (b) control the gas conductance to compensate for radial variations in the velocity of the platen 310. In other embodiments, alternative configurations of the lower cavity 329 and/or the upper cavity 327 may be used to provide the advantages disclosed herein. In some embodiments, the upper cavity 327 shown in FIGS. 5 and 7 may be omitted, for example, when the purge block is directly connected to the chamber lid 380.

Compared to the narrow conduction path 220 shown in FIGS. 1 and 2, gas flow conductance is improved within the upper cavity 327 and/or the lower cavity 329 of the purge block 328 by decreasing the wall thickness (T) and widening the conduction path through which the purge gas flows. As noted above, the gas flow conductance through the conduction path is linearly proportional to the wall thickness (T) between a side edge of the conduction path and a side edge of the purge block, and increases as wall thickness (T) decreases (and vice versa). In the purge block 328 design shown in FIGS. 3-7, the conduction path is provided by the upper cavity 327 and the lower cavity 329 of the purge block 328. As such, the wall thickness (T) is measured between the side edge of the upper/lower cavity and the side edge of the purge block, as shown for example in FIGS. 5 and 6.

In the embodiments shown in FIGS. 6 and 7, a contour of the upper cavity 327 and the lower cavity 329 is similar to a contour of the purge block 328, so that a uniform wall thickness (e.g., T1, T2, T3, and T4 may be substantially equal within approximately 15%) is obtained along a majority of the purge block 328. At the distal end of the purge block 328, the wall thickness (T5) may be increased and a pass-through 326 may be provided for receiving the first purge gas injector 350.

In some embodiments, the gas flow conductance within the upper cavity 327 and/or the lower cavity 329 may be altered in one or more regions of the purge block 328 by varying the wall thickness (T) within those region(s). As shown in FIG. 6, for example, the wall thickness (T) may be varied along the radial axis of the purge block 328 to control gas flow conductance within the lower cavity 329 by providing more (or less) purge gas flow within one or more regions of the purge block. For example, the wall thickness (T) may be reduced to increase gas flow conductance in some region(s) and/or may be increased to decrease gas flow conductance in other region(s).

In some embodiments, the wall thickness (T) of the upper cavity 327 and/or the lower cavity 329 may range between about 20-80 mm. In one preferred embodiment, the wall thickness (T) of the upper cavity 327 and/or the lower cavity 329 primarily ranges between about 40-50 mm. In one example implementation of such an embodiment, T1 may be 44.0 mm, T2 may be 41.3 mm, T3 may be 42.5 mm, T4 may be 43.7 mm and T5 may be 78 mm. Although the wall thickness (T5) is wider at the distal end (i.e., the end of the purge block 328 closest to the outer edge of the platen 310), the gas flow conductance may be greater in this region, due to the proximity of this region to the gas outlet pumping polls 340 (see, FIGS. 3 and 4).

Other dimensions of the purge block 328 may also be selected based on ALD system design and operating parameters. In some embodiments, for example, the gap (G) between the top of the purge block 328 and the chamber lid 380 may be smaller (e.g., about 1 mm) than the gap (e.g., about 3 mm) between the bottom of the purge block 328 and the susceptor 312. Because the gap (G) above the purge block 328 is smaller than the gap beneath the purge block, gas flow (e.g., 1 standard liter per minute (slm)) from the second purge gas injector 370 may be less than the gas flow (e.g., 5-10 slm) from the first purge gas injector 350. Because the gas flow supplied to the upper cavity 327 is smaller in volume ($V_U$) than the gas flow volume ($V_L$) supplied to the lower cavity 329, the depth of the upper cavity 327 may be smaller than the depth of the lower cavity 329 without affecting gas flow conductance. In one example implementation, the depth of the upper cavity 327 may be 5 mm and the depth of the lower cavity 329 may be 16 mm. Other depths and dimensions may be selected based on ALD system design and operating parameters.

Figure 8:
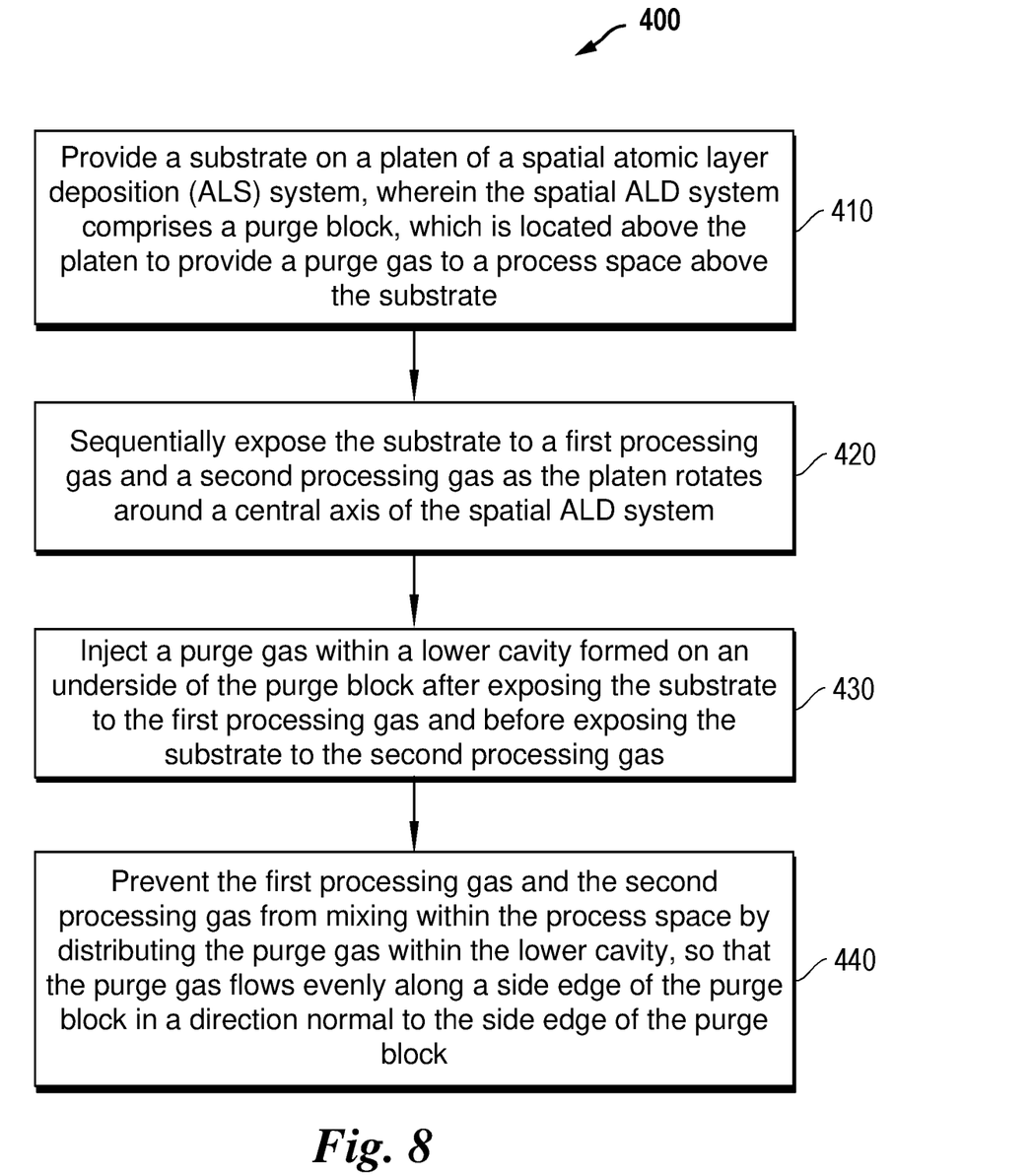
FIG. 8 is a flowchart diagram illustrating an exemplary method utilizing the techniques disclosed herein.

FIG. 8 illustrates one embodiment of an exemplary method that uses the techniques described herein. It will be recognized that the embodiment shown in FIG. 8 is merely exemplary and additional methods may utilize the techniques described herein. Further, additional processing steps may be added to the method shown in FIG. 8 as the steps described are not intended to be exclusive. Moreover, the order of the steps is not limited to the order shown in the figures as different orders may occur and/or various steps may be performed in combination or at the same time.

FIG. 8 illustrates one embodiment method 400 for processing a substrate within a spatial atomic layer deposition (ALD) system. As noted above and shown in FIGS. 3-7, the spatial ALD system may generally include a platen and a purge block, which is located above the platen to provide a purge gas to a process space above the substrate. As shown in FIG. 8, the method 400 may include providing the substrate on the platen in step 410. In step 420, the method 400 may include sequentially exposing the substrate to a first processing gas and a second processing gas as the platen rotates around a central axis of the spatial ALD system. In step 430, the method 400 may include injecting the purge gas within a lower cavity formed on an underside of the purge block after exposing the substrate to the first processing gas and before exposing the substrate to the second processing gas. In step 440, the method 400 may include preventing the first processing gas and the second processing gas from mixing within the process space by distributing the purge gas within the lower cavity, so that the purge gas flows evenly along a side edge of the purge block in a direction normal to the side edge of the purge block.

Further modifications and alternative embodiments of the inventions will be apparent to those skilled in the art in view of this description. Accordingly, this description is to be construed as illustrative only and is for the purpose of teaching those skilled in the art the manner of carrying out the inventions. It is to be understood that the forms and method of the inventions herein shown and described are to be taken as presently preferred embodiments. Equivalent techniques may be substituted for those illustrated and described herein and certain features of the inventions may be utilized independently of the use of other features, all as would be apparent to one skilled in the art after having the benefit of this description of the inventions.

What is claimed is:

1. A spatial atomic layer deposition (ALD) system, comprising:
    a platen for carrying one or more substrates, wherein the platen is configured to rotate 360° around a central axis of the spatial ALD system;
    a first showerhead located above the platen to provide a first processing gas to the one or more substrates as the platen rotates; and
    a purge block located above the platen to provide a purge gas to the one or more substrates after the first processing gas is provided to the one or more substrates, wherein the purge block comprises:
        a lower cavity formed on an underside of the purge block;
        a first purge gas injector provided within the lower cavity for injecting the purge gas beneath the purge block, wherein the lower cavity is configured to provide a lower gas conduction path that distributes the purge gas beneath the purge block;
        an upper cavity formed on a topside of the purge block; and
        a second purge gas injector for injecting a second purge gas above the purge block, wherein the upper cavity is configured to provide an upper gas conduction path that distributes the second purge gas above the purge block.

2. The spatial ALD system of claim 1, wherein a contour of the lower cavity is smaller than a contour of the purge block, so that a uniform wall thickness is obtained along a majority of the purge block, and wherein the uniform wall thickness is measured between a side edge of the lower cavity and the side edge of the purge block.

3. The spatial ALD system of claim 2, wherein the uniform wall thickness is selected from a range comprising 20 mm to 80 mm.

4. The spatial ALD system of claim 2, wherein a wall thickness within one or more regions of the purge block is different from a wall thickness within other regions of the purge block to vary a gas flow conductance provided within the lower cavity in the one or more regions of the purge block.

5. The spatial ALD system of claim 1, wherein the lower gas conduction path is configured to flow the purge gas evenly along a side edge of the purge block in a direction normal to the side edge of the purge block, and wherein
    the upper gas conduction path is configured to flow the purge gas evenly along the side edge of the purge block in the direction normal to the side edge of the purge block.

6. The spatial ALD system of claim 1, wherein a contour of the upper cavity is smaller than a contour of the purge block, so that a uniform wall thickness is obtained along a majority of the purge block, wherein the uniform wall thickness is measured between the upper gas conduction path provided within the upper cavity and the side edge of the purge block.

7. The spatial ALD system of claim 6, wherein the uniform wall thickness is selected from a range comprising 20 mm to 80 mm.

8. The spatial ALD system of claim 6, wherein a wall thickness within one or more regions of the purge block is different from a wall thickness within other regions of the purge block to vary a gas flow conductance provided within the upper cavity in the one or more regions of the purge block.

9. The spatial ALD system of claim 1, wherein a width of the purge block covers a portion of the 360° rotation of the platen, and wherein the portion is selected from a range comprising 10° to 40° of the 360° rotation of the platen.

10. The spatial ALD system of claim 9, wherein the width of the purge block covers 20° of the 360° rotation of the platen.

11. The spatial ALD system of claim 9, wherein the width of the purge block covers 30° of the 360° rotation of the platen.

12. A spatial atomic layer deposition (ALD) system, comprising:
    a platen for carrying one or more substrates, wherein the platen is configured to rotate 360° around a central axis of the spatial ALD system;
    a first showerhead located above the platen to provide a first processing gas to the one or more substrates as the platen rotates; and
    a purge block located above the platen to provide a purge gas to the one or more substrates after the first processing gas is provided to the one or more substrates;
    wherein a width of the purge block covers a portion of the 360° rotation of the platen, and wherein the portion is selected from a range comprising 10° to 40° of the 360° rotation of the platen,
    wherein the purge block comprises:
        a lower cavity formed on an underside of the purge block; and
        a first purge gas injector provided within the lower cavity for injecting the purge gas beneath the purge block,
    wherein a contour of the lower cavity is smaller than a contour of the purge block, so that a uniform wall thickness between 20 mm and 80 mm is obtained along a majority of the purge block, and
    wherein the uniform wall thickness is measured between a gas conduction path provided within the lower cavity and the side edge of the purge block.

13. The spatial ALD system of claim 12, wherein the width of the purge block covers between 20° to 30° of the 360° rotation of the platen.

14. The spatial ALD system of claim 12,
    wherein the lower cavity is configured to provide the gas conduction path that distributes the purge gas beneath the purge block, such that the purge gas flows evenly along a side edge of the purge block in a direction normal to the side edge of the purge block.

15. The spatial ALD system of claim 14, wherein the purge block further comprises:
    an upper cavity formed on a topside of the purge block; and
    a second purge gas injector for injecting a second purge gas above the purge block, wherein the upper cavity is configured to provide an upper gas conduction path that distributes the second purge gas above the purge block, such that the second purge gas flows evenly along the side edge of the purge block in the direction normal to the side edge of the purge block.

16. The spatial ALD system of claim 1, further comprising:
a second showerhead located above the platen to provide a second processing gas to the one or more substrates as the platen rotates; and
a further purge block located above the platen to provide the purge gas to the one or more substrates after the second processing gas is provided to the one or more substrates by the second showerhead, wherein the first showerhead is larger than the second showerhead.

17. The spatial ALD system of claim 12, further comprising:
a second showerhead located above the platen to provide a second processing gas to the one or more substrates as the platen rotates; and
a further purge block located above the platen to provide the purge gas to the one or more substrates after the second processing gas is provided to the one or more substrates by the second showerhead, wherein the first showerhead comprises a first width to have a first angle of the 360° rotation of the platen and the second showerhead comprises a second width to have a second angle of the 360° rotation of the platen, the first angle and the second angle together consume more than half of the 360° rotation of the platen.

18. The spatial ALD system of claim 12, further comprising:
a second showerhead located above the platen to provide a second processing gas to the one or more substrates as the platen rotates; and
a further purge block located above the platen to provide the purge gas to the one or more substrates after the second processing gas is provided to the one or more substrates by the second showerhead, wherein the first showerhead comprises a first width to have a first angle of the 360° rotation of the platen and the second showerhead comprises a second width to have a second angle of the 360° rotation of the platen, the first angle and the second angle together consume 124° rotation of the platen.

19. The spatial ALD system of claim 1, wherein the lower cavity has a depth greater than a depth of the upper cavity.

20. The spatial ALD system of claim 1, wherein a volume of the lower cavity is greater than a volume of the upper cavity.

21. A spatial atomic layer deposition (ALD) system, comprising:
a platen for carrying one or more substrates, wherein the platen is configured to rotate 360° around a central axis of the spatial ALD system;
a first showerhead located above the platen to provide a first processing gas to the one or more substrates as the platen rotates; and
a purge block located above the platen to provide a purge gas to the one or more substrates after the first processing gas is provided to the one or more substrates, wherein the purge block comprises:
a lower cavity formed on an underside of the purge block, the lower cavity having a first volume;
a first purge gas injector provided within the lower cavity for injecting the purge gas beneath the purge block, wherein the lower cavity is configured to provide a lower gas conduction path that distributes the purge gas beneath the purge block;
an upper cavity formed on a topside of the purge block, the second cavity having a second volume smaller than the first volume; and
a second purge gas injector for injecting a second purge gas above the purge block, wherein the upper cavity is configured to provide an upper gas conduction path that distributes the second purge gas above the purge block.

22. The spatial ALD system of claim 21, further comprising a chamber lid, wherein there is a gap between the chamber lid and the topside of the purge block.

* * * * *